United States Patent [19]

Sakai et al.

[11] Patent Number: 4,466,680

[45] Date of Patent: Aug. 21, 1984

[54] ELECTRICAL CONNECTING DEVICE

[75] Inventors: Hirohumi Sakai; Toshiaki Sukeda; Hiroyuki Yodoshi, all of Suzaka; Satoru Imai, Nagano, all of Japan

[73] Assignee: Fujitsu Limited, Kawasaki, Japan

[21] Appl. No.: 333,785

[22] Filed: Dec. 23, 1981

[30] Foreign Application Priority Data

Dec. 29, 1980 [JP] Japan .......................... 55-187224

[51] Int. Cl.³ .................................... H01R 13/629
[52] U.S. Cl. .......................... 339/45 M; 339/75 M; 339/91 R
[58] Field of Search .............. 339/45 R, 45 M, 75 R, 339/75 M, 91 R

[56] References Cited

U.S. PATENT DOCUMENTS

| | | | |
|---|---|---|---|
| 2,811,700 | 10/1957 | Kuch | 339/91 R |
| 2,897,033 | 7/1959 | Ford | 339/45 M |
| 4,010,998 | 3/1977 | Tolnar, Jr. et al. | 339/91 R |
| 4,026,624 | 5/1977 | Boag | 339/91 R |
| 4,141,616 | 2/1979 | Gottlieb | 339/91 R |
| 4,379,606 | 4/1983 | Clark et al. | 339/206 R |

*Primary Examiner*—John McQuade
*Attorney, Agent, or Firm*—Staas & Halsey

[57] ABSTRACT

The present invention relates to an electrical connecting device for effectuating electrical connection of a first connector unit and a second connector unit by inserting said first connector unit into the accepting port of said second connector unit. This electrical connecting device has a rotating member within said second connector unit as a coupling portion for engaging the second connector unit with the first connector unit. This rotating member rotates in combination with the inserting operation of said first connector unit, and engages with said first connector unit, pushing it in the inserting direction. In addition, the rotating member, when locked in place to secure the first connector unit, can be released by an eject button.

10 Claims, 23 Drawing Figures

4,466,680

ELECTRICAL CONNECTING DEVICE

BACKGROUND OF THE INVENTION

This invention relates to an electrical connecting device having at least two connector units, the electrical terminals of both connector units being connected by inserting the first connector unit into the second connector unit.

This invention concerns various advantages of an electrical connecting device having a first connector unit with a cassette type magnetic bubble memory unit for accommodating the magnetic bubble memory element, and a second connector unit with a holder unit which allows insertion thereto of said bubble memory unit and connects it to a main apparatus.

When electrically connecting two connector units, a plug terminal is usually provided at one unit and a jack terminal is provided at the other unit. These units are coupled and electrical connection is obtained by inserting the plug terminal into the jack terminal.

This connecting structure is superior in reliability for electrical connection of the pressure contact type. However, such a connecting structure has the disadvantage that the insertion force and withdrawal force increase as the number of terminals increase. In addition, since the insertion force increases in accordance with the insertion distance, the operator may misjudge the connection, namely, he cannot detect how far the unit must be inserted for perfect electrical connection. An operator who misjudges may execute the inserting operation with excessive insertion force and thereby risk breaking the terminals.

SUMMARY OF THE INVENTION

It is an object of the present invention to provide a connecting structure which ensures reliable electrical connection between connector units with a small insertion force and withdrawal force.

It is another object of the present invention to provide a connecting device which assures satisfactory insertion of connector units and excellent operability.

It is a further object of the present invention to provide a structure which ensures reliable electrical connection between a cassette type magnetic bubble memory unit and a connector unit, consisting of a holder unit which accommodates said memory unit, with a small insertion force (and withdrawal force) and also which allows the operator to judge insertion correctly and at the same time providing excellent operability.

In order to attain such objects, the electrical connecting device of the present invention provides electrical terminals on both the first connector unit and the second connector unit, which are connected together by inserting said first connector unit into an accepting port of said second connector unit, and wherein rotating member providing the coupling means which couples with said first connector unit is provided within said second connector unit, said rotating member rotates in accordance with the inserting operation of said first connector unit and simultaneously couples with said first connector unit to push it in the inserting direction.

BRIEF DESCRIPTION OF THE DRAWINGS

FIGS. 9A–C illustrate the first embodiment of the cassette-type magnetic bubble memory device of the present invention, with FIG. 9(A) being a plan view before electrical connection, while FIG. 9(B) is a side view of the same condition and FIG. 9(C) is a side view showing electrical connection.

FIGS. 12A and B illustrate the third embodiment of the bubble memory device of the present invention, illustrating particularly the slider with FIG. 12(A) being a side view showing electrical connection, while

FIGS. 18A and B illustrate side views of the assembled holder unit of the present invention, with FIG. 18(A) showing the operating condition before the cassette is inserted, while

DETAILED DESCRIPTION OF THE PREFERRED EMBODIMENTS

While the present invention can be adopted to any electrical connecting device which establishes the electrical connection of terminals of both a first connector unit and a second connector unit by inserting said first unit into the second unit, the preferred embodiment explained herein is adopted for a cassette-type magnetic bubble memory system.

Figure 1:
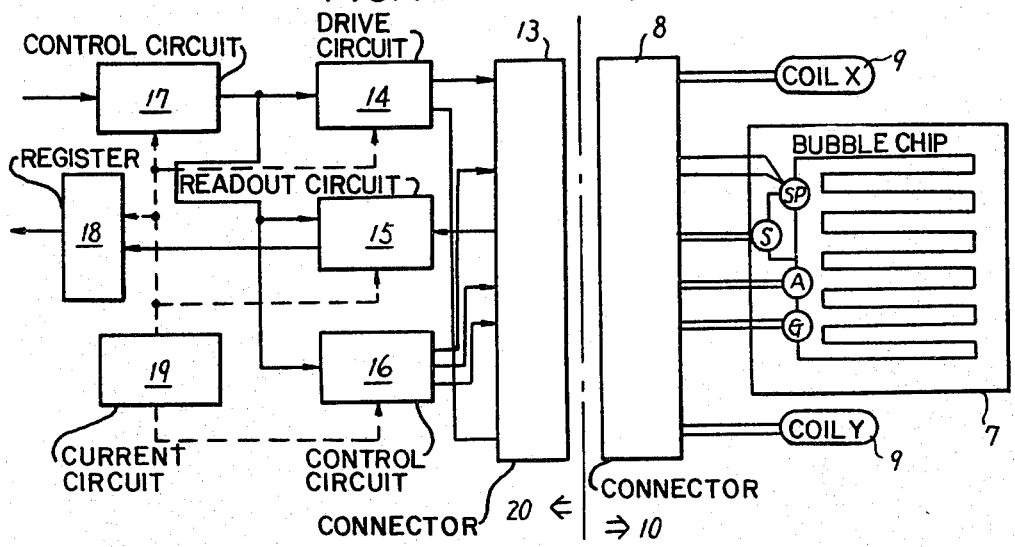
FIG. 1 is a circuit diagram illustrating an example of a cassette-type magnetic bubble memory system for incorporating the present invention.

FIG. 1 is the circuit structure of an example of this bubble memory system.

In this figure, 10 is the cassette-type magnetic bubble memory unit, 20 is the holder unit which is the terminal of the main unit. 7 is the bubble chip providing each functional section such as a magnetic bubble generator G, a splitter SP, a sensor S and an erasor A.

In the figure, the bubble chip 7 has a single loop structure but it can also be of a major-minor loop structure. 8 is a connector providing electrical terminals for the cassette-type magnetic bubble memory unit, 9 is the rotating field generating coil consisting of an X coil and a Y coil arranged in such a manner as to cover the bubble chip. The magnetic bubble memory element is composed of bubble chip 7, coil 9 and a bias magnet packaged within a shield case, which magnet and shield case will be explained later. 13 is the connector providing the electrical terminals corresponding to the connector 8 in the side of bubble memory unit 10; 14 is the coil driving circuit which generates the rotating field along the bubble chip surface by supplying a sine wave current or triangular current; 15 is the bubble readout circuit; 16 is the magnetic bubble control circuit comprising the bubble write circuit for generating the bubbles by supplying a current to the magnetic bubble generator G, the circuit for splitting the bubbles by supplying a current to the splitter SP, the circuit for detecting bubbles by supplying a current to the sensors and the circuit for erasing unwanted bubbles by supplying a current to the erasor A. 17 is the control circuit which controls the coil drive circuit 14, bubble readout circuit 15 and magnetic bubble control circuit 16 in accordance with the commands sent from the central processing unit. 18 is the register and 19 is the current circuit. Such a structure makes it possible to connect a comparatively small and portable bubble memory unit 10 to the holder unit 20 via the connectors 8 and 13, and also to drive the bubble memory element in the unit 10 via the unit 20 in accordance with the control signal sent from the central processing unit.

Figure 2:
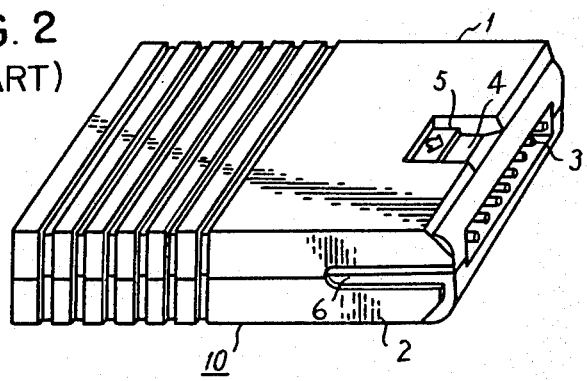
FIG. 2 is a perspective view of a cassette-type magnetic bubble memory unit proposed in the commonly-assigned U.S. Application Ser. No. 192,804 filed Oct. 1, 1980, entitled "Magnetic Bubble Memory Device".

As shown in FIG. 2, the existing bubble memory unit has a magnetic bubble memory element (not illustrated) accommodated into the space formed by the upper and lower cases 1, 2 which are both formed into a box-type mold, and a plurality of slide contact-type electrical terminals 3 forming the connector 8 (refer to FIG. 1) are provided at the inserting end.

At the inserting end of the external surface of the upper case 1 is a concave 4 and a slide plate 5 for setting the bubble data write inhibit condition or write ready condition in said concave 4 with freedom of sliding.

Moreover, the aggregated upper case 1 and lower case 2 are provided with guide grooves 6 for preventing mis-insertion which are respectively provided on both sides and each has a different width.

Figure 3:
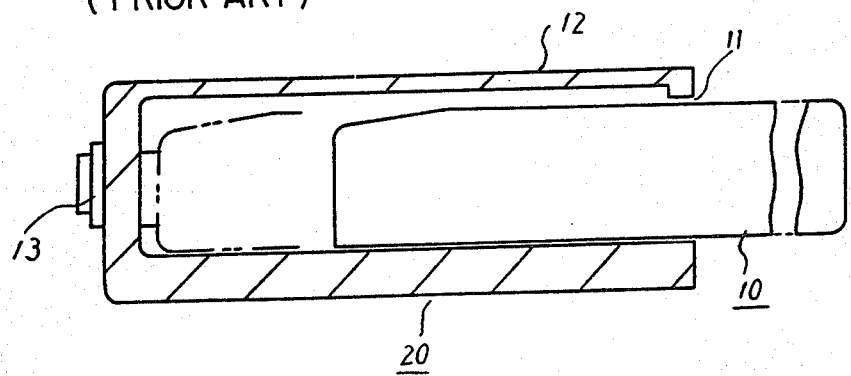
FIG. 3 is a side view illustrating the condition before electrical connection of the existing memory unit and holder unit.

As shown in FIG. 3, the existing holder unit 20 has a molded holder case 12 having the inserting port 11 of bubble memory unit and is used in such a manner that said holder case 12 is mounted to the panel surface of the main device. The connector 13 provides an electrical terminal (not illustrated) having a springing property. The connector 13 is provided opposite the inserting port 11 and corresponds to the electrical terminal 3.

In this existing structure, the bubble memory unit 10 outlined in the figure is inserted into the inserting port 11 and electrical connection is obtained by the sliding contact of the electrical terminals of both units 10 and 20. In such an existing structure, the electrical terminal 3 is the plug terminal, while the electrical terminal of connector 13 is the jack terminal. The structure of inserting the plug terminal into the jack terminal assures excellent reliability of electrical connection and maintains a stable contact condition against external vibration.

However, as already explained above, this existing structure requires a large inserting force and withdrawal force. In addition, since the inserting force gradually increases as the bubble memory unit is being inserted, an operator may misjudge the connection, and resultingly there is a risk that the inserting operation will be carried out with an excessive inserting force. Moreover, since no lock mechanism for reliably maintaining the perfect contact condition is provided, imperfect connections cause system down time because the unit may withdraw naturally due to external vibration.

FIG. 4 to FIG. 8 illustrate the cassette type magnetic bubble memory unit of the present invention.

Figure 4:
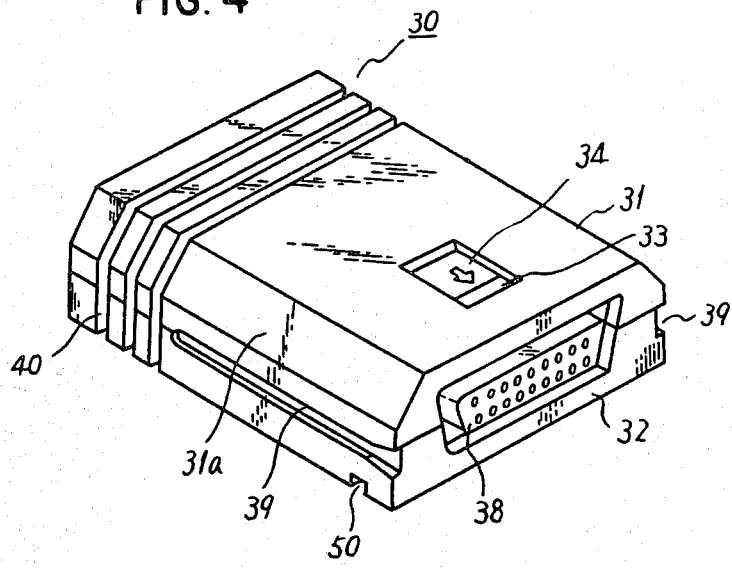
FIG. 4 is a perspective view of the cassette-type magnetic bubble memory unit of the present invention.
Figure 5:
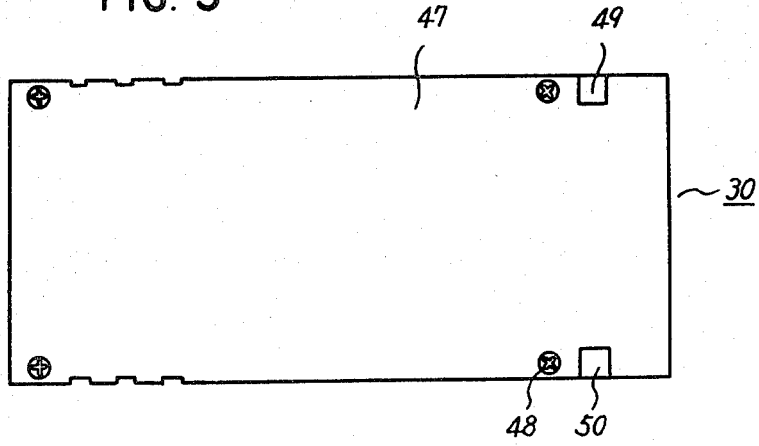
FIG. 5 is a plan view of the memory unit of FIG. 4 of the present invention viewed from the lower side.

This memory unit 30 resembles the existing unit 10 shown in FIG. 2, but is largely different due to a pair of external coupling grooves 49 and 50 (refer to FIGS. 4, 5). The grooves 49, 50 are provided at the side of the inserting end of the lower surface 47 in the form of a concave. Of this memory unit 30, 31 and 32 are the molded upper and lower cases, respectively. Particularly, the outline view of the external surface 31a of the upper case 31 is formed asymmetrically and large chamfering is executed to such external surface in order to prevent reverse insertion of the cassette. As explained above, the cassette accepting port of the holder is so formed as to engage the external shape of said cassette.

Figure 6:
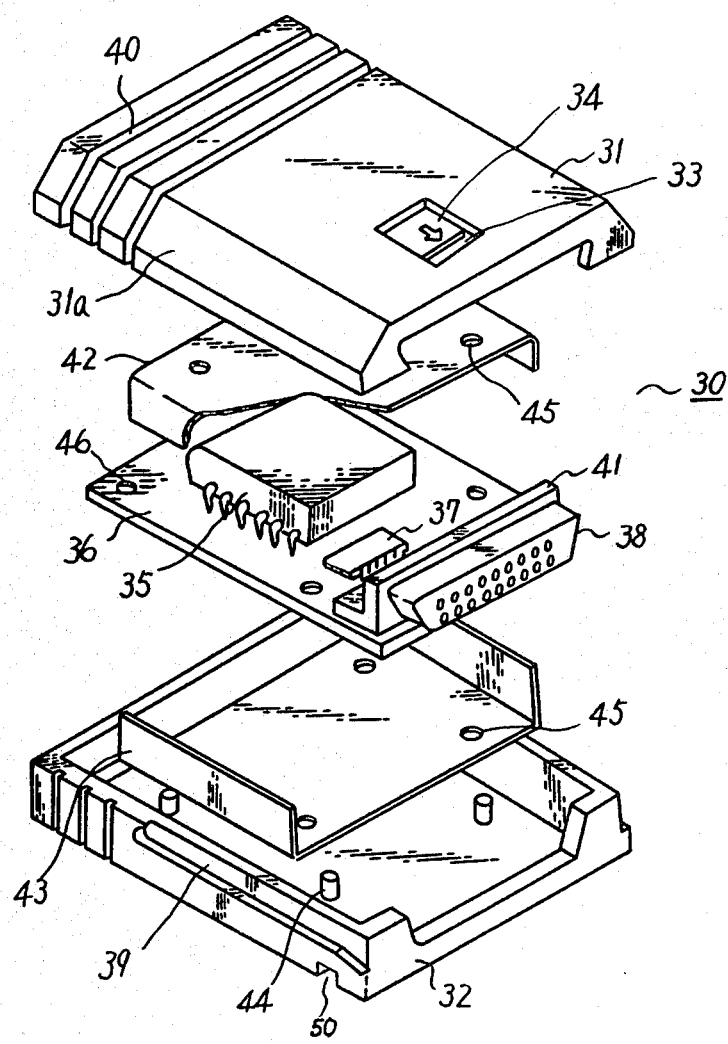
FIG. 6 is an exploded perspective view of the memory unit shown in FIG. 4 of the present invention.
Figure 7:
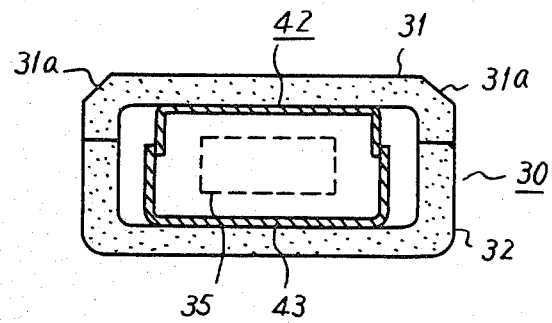
FIG. 7 is a cross-sectional view of the inside of the memory unit shown in FIG. 4 of the present invention.

As seen in FIG. 6, 33 is the concave, 34 is the slide plate used as the write inhibit member, 35 is the magnetic bubble memory element armoured by shield plates 42 and 43, 36 is the printed circuit (PC) board mounting the magnetic bubble memory 35 and 37 is the integrated circuit (IC) for the sense amplifier of the bubble. 38 is the connector which is the female connector providing the jack terminal. The reason such a female connector is used is that the jack terminal of a female connector is positioned within an insulator, which is different from the projected position of the plug terminal in the case of a male connector and, therefore, there is not as much chance of directly touching the terminal with bare fingers and thus, the female connector reduces the possibility of electrostatic breakdown of IC 37. 39 is a guide groove made in both sides of the memory unit, each having a different groove width in view of preventing mis-insertion; 40 is the slide stop groove; 41 is the connector mounting board; 42 and 43 are magnetic shield plates which are composed of ferro-magnetic material having high permeability and have an almost ]-shape cross-section. The shield plates 42 and 43, as shown in the cross-sectional view of FIG. 7, are arranged in such a way as to surround the memory element 35.

As also shown in FIG. 6, the shield plates 42, 43 are mounted by inserting the projections 44 which are formed on the rear surface of the lower case 32 and the upper case 31 (not shown) into the holes 45, and then the end of each projection 44 is thermally caulked. In this case, the projection 44 of the lower case 43 passes the hole 46 of the PC board 36 and is simultaneously fixed. Moreover, the shield plates 42 and 43 overlap where their edges meet so that the edges do not collide when the upper and lower cases 31 and 32 are coupled by means of the screw 48 (refer to FIG. 5) and thereby excellent magnetic shield effect can be obtained.

Figure 8:
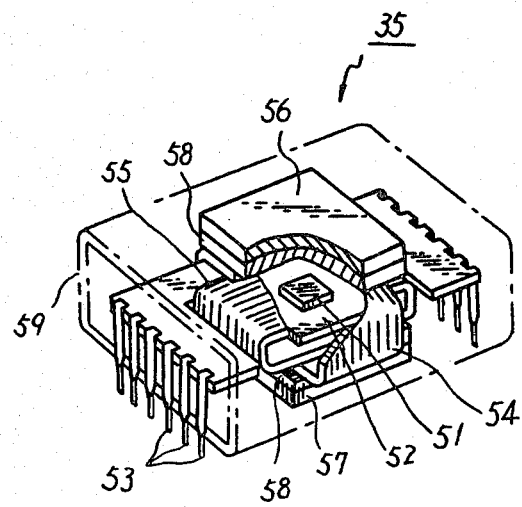
FIG. 8 is a perspective view of the magnetic bubble memory element accommodated in the memory unit of FIG. 4 according to the present invention.

As shown in FIG. 8, the memory element 35 is composed of an insulating PC board 52 having a magnetic bubble memory chip 51, lead terminals 53 housed within the magnetic shield case 59, X coil 54 and Y coil 55 for generating the rotating field, bias magnets 56 and 57 and a couple of upper and lower magnetic field regulating plates 58 which are packaged.

The memory unit 30 explained above in detail is characterized primarily by providing the coupling grooves 49, 50 at the surface of the case.

Figure 9A:
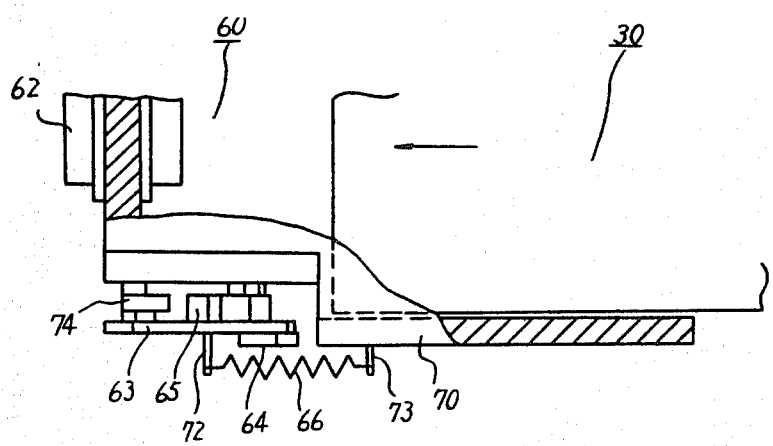
Figure 9B:
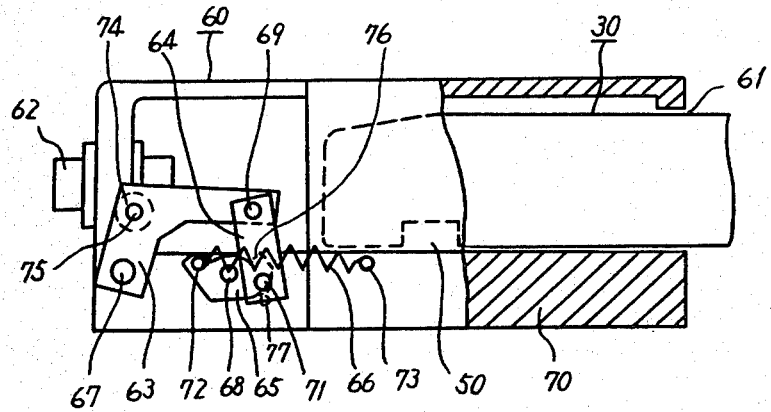
Figure 9C:
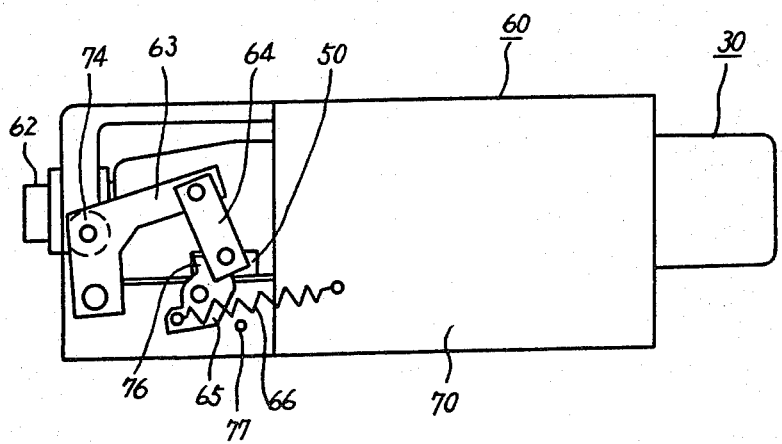

FIGS. 9A–C illustrate another embodiment of the cassette-type magnetic bubble memory device of the present invention, providing a holder unit 60 to which the above-mentioned memory unit 30 is inserted.

The holder unit 60 has a molded box-type holder case 70 which opens at the front side and provides an accepting port 61 for the memory unit 30. Moreover, at the rear side of the case 70 is a male connector 62 providing a plug terminal (not illustrated). In addition, provided at the both sides of the rear part of the case 70 is a coupling mechanism for memory unit 30 consisting of the L-shaped metal lever 63, metal lever 64, a resin-molded rotating member 65 and a tensile coil spring 66.

The lever 63 is mounted at the one end with freedom of rotation relative to the case 70 by means of the shaft 67. The rotating member 65 is also mounted at the center with freedom of rotation relative to the case 70 by means of the shaft 68. The lever 64 couples the other end of lever 63 and the one end of rotating member 65 via the rotating shafts 69, 71. The coil spring 66 is extended between the pin 72 mounted to the other end the rotating member 65 and the pin 73 mounted to the case 70. Moreover, the lever 63 is provided at the center of its internal surface, with a roller 74 to which the end top of memory unit 30 collides by means of the shaft 75 and, on the other hand, the one end of the rotating member 65 is provided with a projected hook 76 for coupling with the groove 50. Furthermore, the coil spring 66 is located in the upper side of shaft 68 as shown in FIGS. 9(A), (B) when the rotating member 65 is in the stationary condition. Therefore, the rotating member 65 is pulled by the coil spring 66 and rotates in the clockwise direction and with a rotating angle predetermined by the stop pin 77.

The memory unit 30 is inserted into the holder unit 60 thus configured, establishing the conditions shown by FIGS. 9(A), (B). When the memory unit 30 is further inserted, the end surface of said unit 30 comes into contact with the roller 74. When it is further inserted, the roller 74 is pushed and moves backward. Thereby the lever 63 rotates for the specified angle and rotates the rotating member 65 via the lever 64. At this time, the coil spring 66 is a little elongated, the centers of the shaft 68 and pins 72, 73 are located on the same straight line and the spring's tensile force is a little increased. Then, the hook 76 of the rotating member 65 is engaged at its crest with the groove 50 of the memory unit 30. When the center of pin 72 is lower than the imaginary line connecting the centers of shaft 68 and pin 73, the rotating member 65 is then pulled by the coil spring 26 and rotated counterclockwise. This rotating operation causes the hook 76 to further engage with the groove 50, pulling the memory unit 30 in the inserting direction and resulting in the condition of FIG. 9(C).

The tensile force of coil spring 66 working in the direction opposite the inserting direction at the initial inserting period of the memory unit 30 works in the same direction as the inserting direction when the rotating member 65 rotates for the specified angle. Thereby, as shown in FIG. 9(C), the memory unit 30 is perfectly inserted into the holder unit 60 and the connectors of both units are electrically connected. When the memory unit 30 is manually inserted, an operator may feel a snapping action which means that the inserting force suddenly becomes less when the tensile force of coil spring 66 changes direction. The inserting feeling is detected and imperfect insertion can be eliminated by giving a snap action to the inserting operation.

Moreover, since the engagement between the hook 76 and groove 50 is maintained by the tensile force of coil spring 66, the connection is also stable against external vibration. Moreover, the tensile force of the spring 66 also lessens the inserting force. The withdrawal of memory unit 30 from the holder unit 60 can be done by pulling the part of unit 30 projecting from the front side of unit 60.

Figure 10:
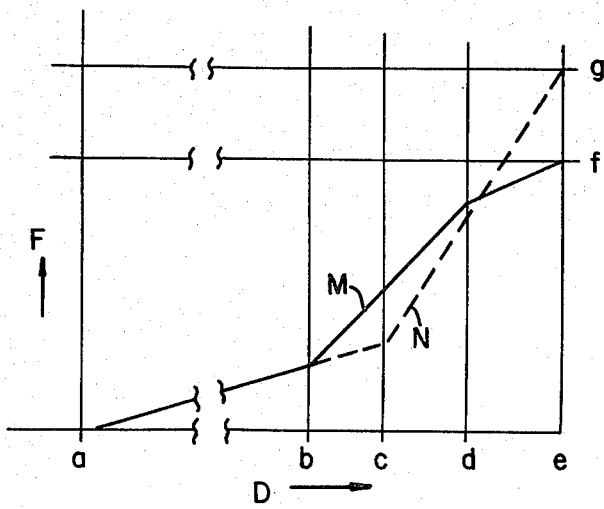
FIG. 10 is a graph showing the insertion force characteristic of the memory unit of the present invention.

FIG. 10 shows the relation between the inserting force F and the inserting distance D of memory unit 30 while being inserted into the holder unit 60. In this figure, the characteristic M indicated by the solid line corresponds to the bubble memory device of the present invention, while the characteristic N indicated by the dotted line corresponds to the device shown in FIG. 3. In addition, the point a on the horizontal axis for plotting the inserting distance D means is the insertion start timing, the point b is the contact start point of the memory unit 30 and roller 74, the point c is the contact start point of the electrical terminals of both units, the point d means is the timing where the tensile force direction of the coil spring 66 is inverted and the point e means is the timing where the contact of mutual electrical terminals is completed. On the other hand, the point f on the vertical axis for plotting the inserting force F is the inserting force when the insertion of the characteristic M is completed, while the point g is the inserting force when the insertion of characteristic N is completed.

As is obvious from the figure, at point b the inserting force for characteristic M quickly increases as compared with that of the characteristic N, but the increase rate from the point d drastically decreases as compared with that of characteristic N. At the point e where insertion is completed, the inserting force in the present invention is reduced for 20% or more as compared with the existing device shown in FIG. 3.

FIG. 11 is the cassette-type magnetic bubble memory device depending on the other embodiment of present invention. This device is different from the embodiment of FIG. 9 in that the coupling mechanism of the memory unit provided in the holder unit 60 is provided with a stopper means.

This stopper means has a through hole 78 provided at the bottom of case 70. A slider 79 and a coil spring 80 pushing the slider 79 inward, are arranged within said hole 78. The slider 79 and the end of lever 63 are moreover connected by means of the metal wire 82 via the roller 81. The roller 81 can freely rotate by means of the shaft 83.

Figure 11A:
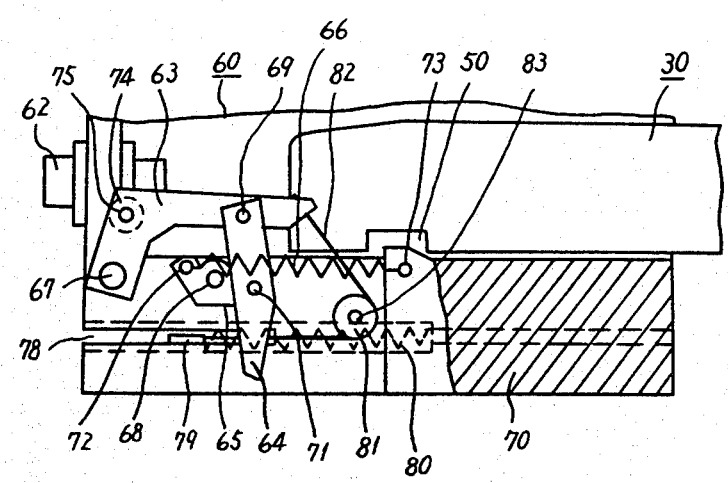
FIGS. 11A and B illustrate the second embodiment of the bubble memory device of the present invention, with FIG. 11(A) being a side view before electrical connection, while FIG. (B) is a side view showing electrical connection.
Figure 11B:
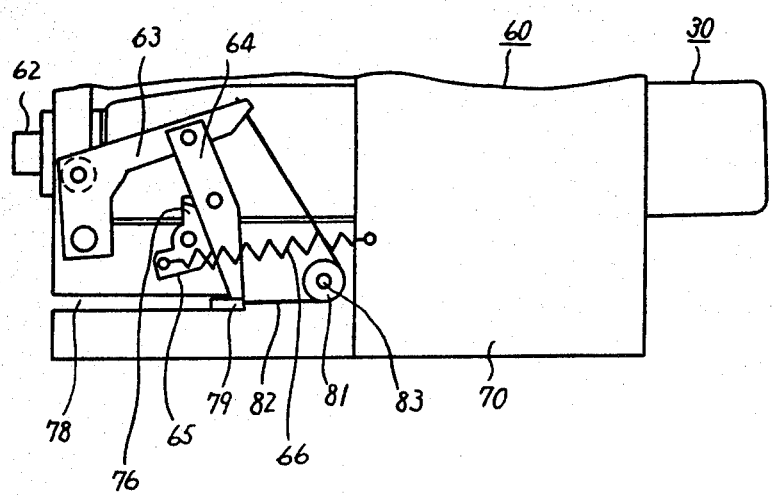

In the stationary condition of FIG. 11(A), the slider 79 is located centrally below the lever 63 by the tensile force of coil spring 80. When the memory unit 30 is inserted during this condition, the slider 79 is pulled forward via the wire 82 by the rotating operation of the rotating member 65 and lever 63, and the slider 79 enters under the end of lever 64 moved upward as shown in FIG. 11(B). In this condition, the lever 64 cannot move, resulting in the stop operation. Namely, once the memory unit 30 is inserted perfectly, it cannot be withdrawn even if it is pulled at the projecting part of the unit 30 because the lever 64 is engaged by means of the slider 79.

For the withdrawal of memory unit 30 of FIG. 11(B), it is necessary to restore the lever 64 to its original position by inserting a rod wrench (not illustrated) into the through hole 78 from the front side of case 70 and pushing the slider 79 back via the coil spring 80. In this condition, the memory unit 30 can be removed.

According to the present embodiment, natural withdrawal by external vibration is prevented perfectly, and also careless withdrawal is prevented.

Figure 12A:
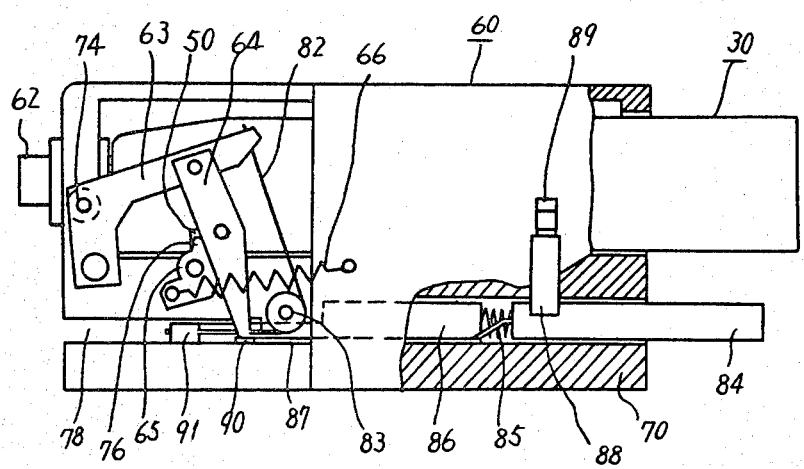
Figure 13:
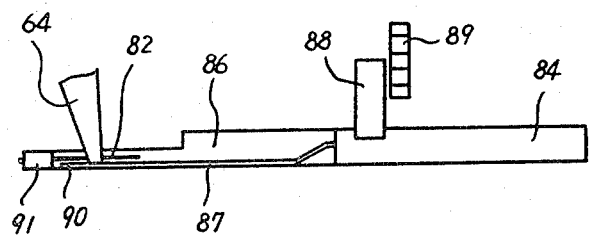
FIG. 13 is a side view of the slider shown in FIGS. 12A and B for resetting electrical connection according to the present invention.

FIGS. 12A and B, and FIG. 13 show the third embodiment of the cassette-type magnetic bubble memory device of the present invention.

This device is characterized by further improving the stopper means of FIGS. 11A and B and this embodiment will be described in more detail.

This stopper means is composed of an eject button 84 which is projected a specified length from the front surface of holder unit 60, an eject slider 86 which is connected to the eject button 84 via the coil spring 85, and a lock slider 87 whose front end is fixed to the eject button 84 and is accommodated within the through hole 78. The eject button 84, moreover, is provided with a photo-cam 88 fixed and projecting to the side (near the front side of the figure). Moreover, a photo-sensor 89 is provided at the side of holder unit 60.

As shown in FIG. 12(A), when the memory unit 30 is inserted into the holder unit 60, the end of photo-cam 88 is inserted into the center of photo-sensor 89.

Then, as explained previously, the rotating member 65 which has rotated with a tensile force of coil spring 66 engages the hook 76 with the groove 50 and establishes the electrical connection of memory unit 30. Simultaneously, the lever 63 rotates and pulls forward the eject slider 86 and the eject button 84 via the wire 82. Thereby, the end 90 of lock slider 87 (projected to the front side of the figure) enters under the end of lever 64, resulting in the locked condition of memory unit 30. This locked condition and electrical connecting condition are output by the photo-sensor 89. The reference numeral 91 is the end of eject slider 86 to which the end of wire 82 is fixed.

The memory unit 30 can easily be withdrawn from the condition of FIG. 12(A) by pushing the eject button 84 with fingers and then pulling the unit projected from the front side of holder unit 60. Namely, when the eject button 84 is depressed, as shown in FIG. 13, the coil spring 85 is compressed and the rear surface of eject button 84 comes into contact with the front surface of eject slider 86. Then, the lower end surface of photo-sensor 89, photo-cam 88, lever 64 and the end 90 of lock slider 87 are respectively placed in the zig-zag condition. Resultingly, the photo-sensor 89 sends a "lock restoration" signal to the controller informing withdrawal of the cassette and simultaneously slightly before the lever 64 is unlocked. When the eject button 84 is further depressed, the eject slider 86 moves backward and thereafter the wire 82 fixed to the end 91 is pulled backward.

Figure 12B:
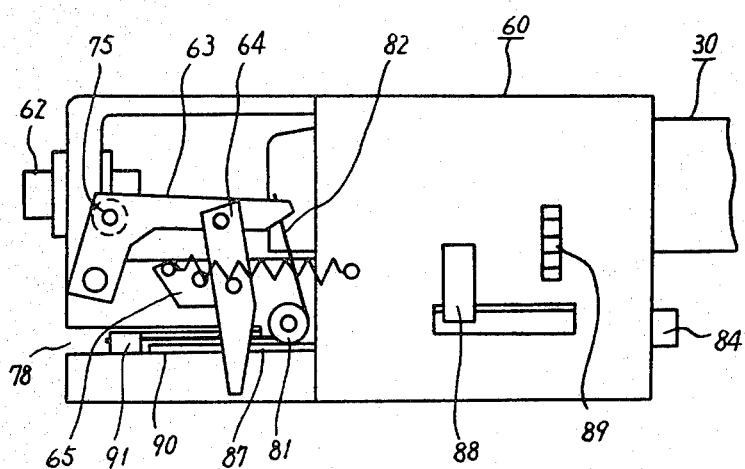
FIG. 12(B) is a side view after electrical connection is reset.

Thereby, the lever 63 and rotating member 65 rotate and as shown in FIG. 12(B), the memory unit 30 can be withdrawn.

When withdrawing the memory unit 30, the pressure force (withdrawal force) of eject button 84 can be easily set to ⅓ or lower of the above-mentioned inserting force by the coupling lever ratio of the levers 63, 64, rotating member 65 and the roller 81.

According to the present embodiment, the withdrawal operation of memory unit 30 is easier than the device shown in FIG. 11.

At the time of the withdrawal operation, the lock restoration signal is generated before actual electrical disconnect of the memory unit 30 is effected, and, the bubble data of memory element 35 can be protected from a careless withdrawal operation.

FIG. 14 to FIG. 18B show the practical structural example of the holder unit 60 indicated in FIGS. 12A and B.

Figure 14:
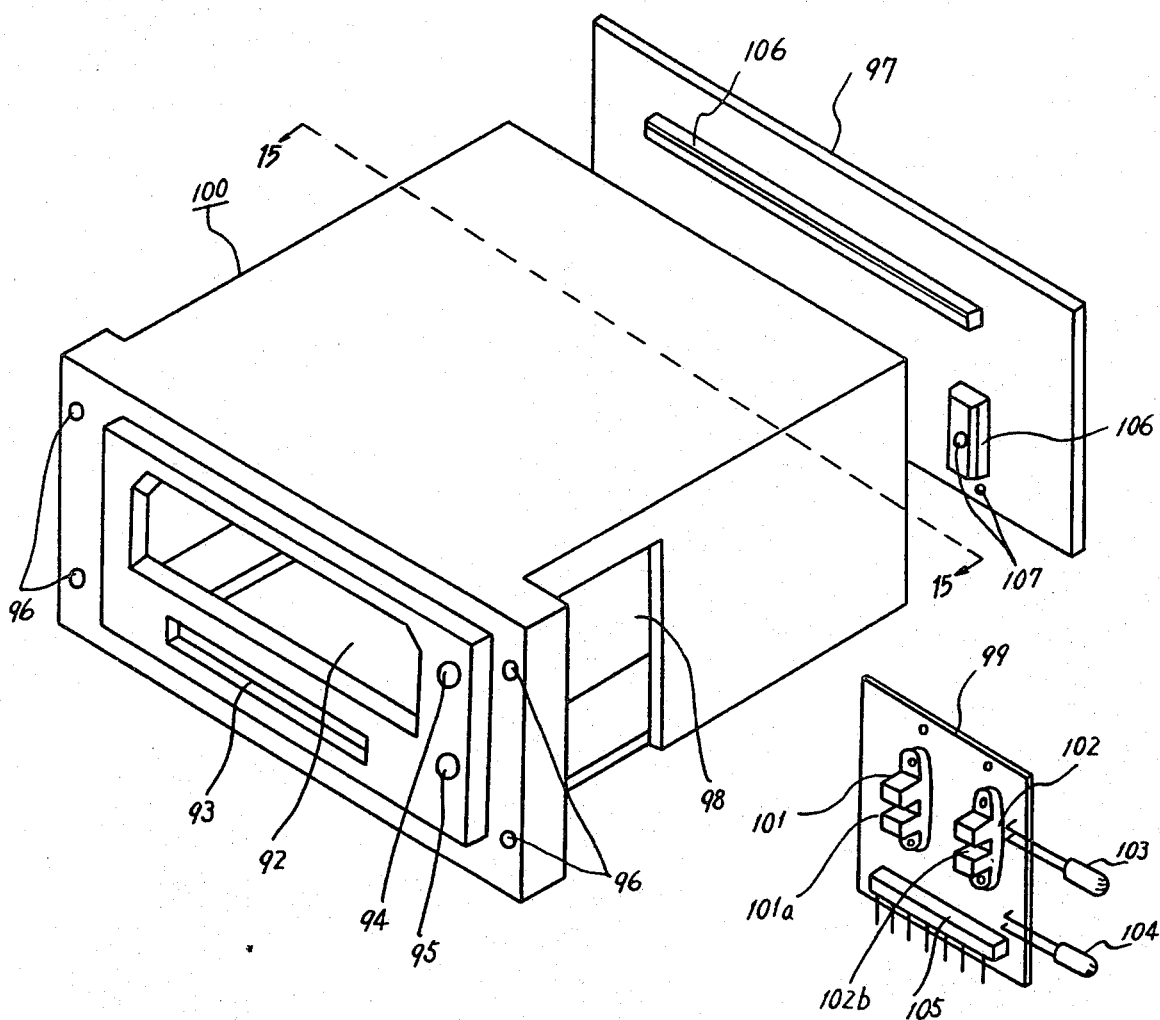
FIG. 14 is an exploded perspective view of the holder case according to the present invention.
Figure 15:
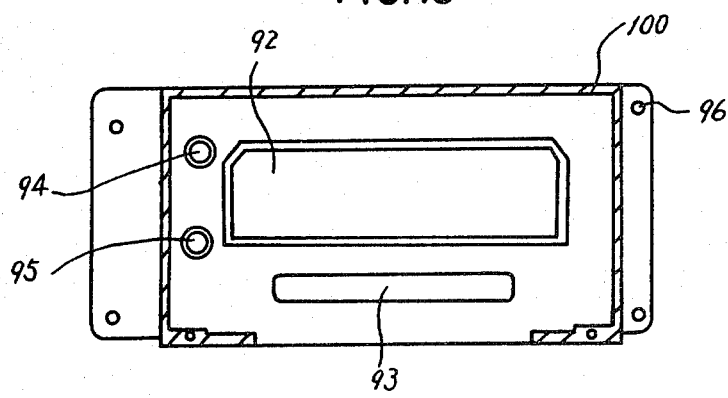
FIG. 15 is a cross-sectional view of the holder case of the present invention viewed from along broken line 15—15 of FIG. 14.

In these figures, FIG. 14 and FIG. 15 show the holder case 100 of holder unit 60. This case 100 is a resin molded box-type case and its front side is provided with an accepting port 92 for the memory unit 30, a projection port 93 for the eject button 84, light emitting diode inserting holes 94, 95 and a hole 96 for fixing the case. In addition, the rear surface is open, but is covered by a separate metal plate 97.

The forward end of one side is formed with an opening port 98 that is covered by a print board 99. The print board 99 mounts a couple of photo-sensors 101, 102, light emitting diodes 103, 104 and connector 105. This print board is mounted to the case 100 with the above parts mounted inside. The light emitting diodes 103, 104 indicate the magnetic bubble drive condition and data write condition. The one photo-sensor 101 detects the slide plate 34 of memory unit 30, while the other photo-sensor 102 detects the condition of eject button. In addition, the photo-sensors 101 and 102 detect the slide plate 34 at the centers 101a, 102b.

The metal plate 97 is provided in its inside with a projection 106 for preventing the bending of case 100, and a hole 107 wherein a fixing screw is provided.

Figure 16:
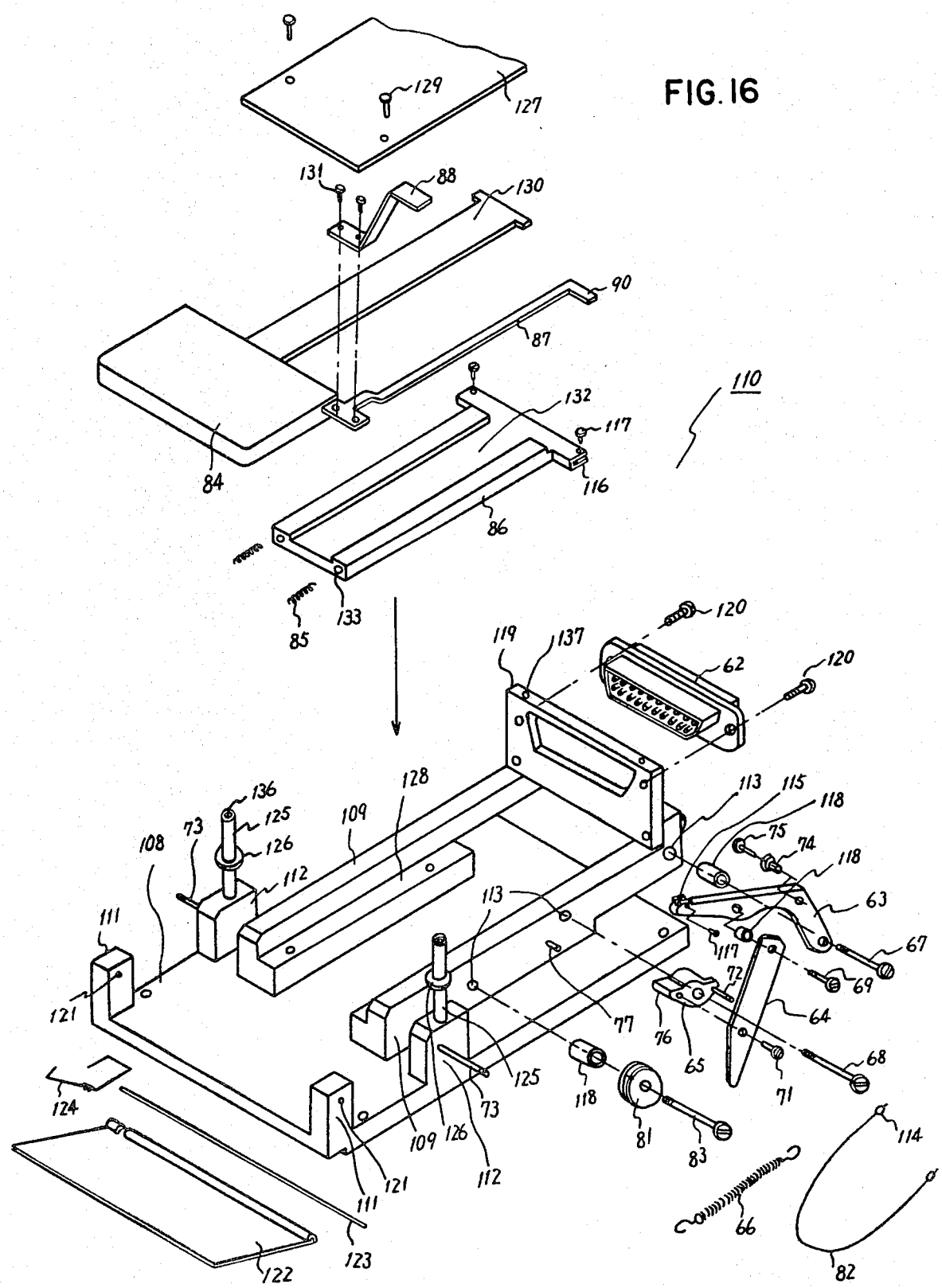
FIG. 16 is an exploded perspective view of the holder unit of the present invention as accommodated within the case of FIG. 14.
Figure 17:
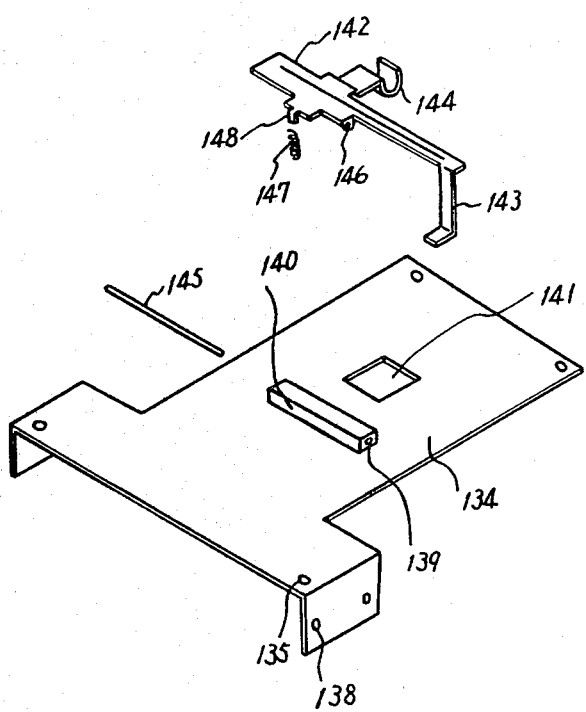
FIG. 17 is an exploded perspective view of the cover of the holder unit of FIG. 16 of the present invention.

As shown in FIG. 16, the holder unit 110 being accommodated in the case 100 is provided with a plurality of parts mounted on the base plate 108 consisting of machined metal.

On the surface of base plate 108, mounting plates 109, 111, 112 are positioned. On the mounting plate 109, the abovementioned levers 63, 64 rotating member 64 and roller 81 are mounted by means of the shafts 67, 68, 69, 71 and 83.

FIG. 16 shows the condition that the lever 63 is mounted to the one mounting plate 109 and such a lever is also provided on the external surface of the other mounting plate 109. Moreover, the lever 63 is provided with the roller 74 on the shaft 75, and the coil spring 66 is extended between the pins 72 and 73.

The mounting plate 109 is provided with holes 113 to which the shafts 67, 68, 83 and the stop pin 77 are screwed. A metal ball stopper 114 is fixed at both ends of the metal wire 82, and each metal ball 114 is placed in the groove 115 of the end of lever 63 and the groove 116 of eject slider 86 and are held by the pin 117. 118 is the metal ring. At the rear side of mounting plate 109, the mounting plate 119 of connector 62 is fixed by means of the screws 120. In the hole 121 of the mounting plate 111, the cover 122 of the accepting port 92 is supported from the rear side by the shaft 123. The spring 124 is connected to the shaft 123, presses the cover 122 to the accepting port 92. The cover 122 usually covers the accepting port 92 under the pressure of the spring 124 but moves inside when the memory unit 30 is inserted into the accepting port 92. When the memory unit 30 is removed, the cover 122 again covers the accepting port 122 on account of the spring 124.

On the mounting plate 112, the pole 125 is fixed with a resin ring 126 for guiding the guide groove 39 of the memory unit 30.

The mounting plate 109 allows for the arrangement of the eject slider 86, the eject button 84 and the cover 127. The cover 127 is fixed to the level difference part 128 of mounting plate 109 by the screws 129. The eject button 84 is provided with the guide plate 130 and the lock slider 87, and the slider 87 is fixed with the photo-cam 88 by the screws 131. The photo-cam 88 corresponds to the detector 102b of the photo-sensor 102 at the horizontal part of the end portion.

The guide plate 130 and slider 87 are formed by punching a sheet of metal plate and their edges are inserted into the eject button 84 at the time of resin molding the eject button 84. The edge 90 of the slider 87 is bent in the form of an L-shape and is used to lock the lever 64. On the surface of slider 86, the guide groove 132 of guide plate 130 is formed, and at one edge of the slider 86, the hole 133 for accommodating the spring 85 is formed.

This stopper mechanism is assembled as follows. The eject slider 86 is placed on the base plate 108 within the mounting plate 109, and the eject button 84 is then placed thereon. The eject button 84 places the guide plate 130 into the groove 132 and arranges the slider 87 between the mounting plates 109 and 112. Moreover, the springs 85 are provided between the slider 86 and the eject button. Thereafter, the cover 127 is mounted and thereby the eject button 84 and slider 86 can freely slide between the base plate 108 and cover 127.

The cover 134 (indicated in FIG. 17) is mounted on the holder 110. The cover 134 is fixed by matching the holes 135 in the four corners with the holes 136 of pole 125 and the holes 137 of mounting board 119. The holes 138 offer the screwing holes for fixing the print board 99.

On the surface of the cover 134 is a support plate 140 providing a through hole 139 and a hole 141. Moreover, on the surface of cover 134, the detecting plate 142 is mounted. The detecting plate 142 is formed by punching and bending a metal plate. At the edge of detecting plate 142, the photo-cam 143 is formed, and at the center of detecting plate 142, the detecting chip 144 of the slide plate 34 is positioned, respectively. The horizontal portion of the edge of the photo-cam 143 corresponds to the detector 101a of photo-sensor 101. The detecting plate 142 allows the detecting chip 144 to project downward through the hole 141 and freely rotates to guide downwardly the photo-cam 143.

Namely, such detecting chip 142 is mounted as follows. The shaft 145 is inserted into the through hole 139 and the projected part in both ends are inserted into the holes of detecting plate 142. The coil spring 147 is supported by the projected chip 148, pressing the detecting chip 144 to face downward.

Figure 18A:
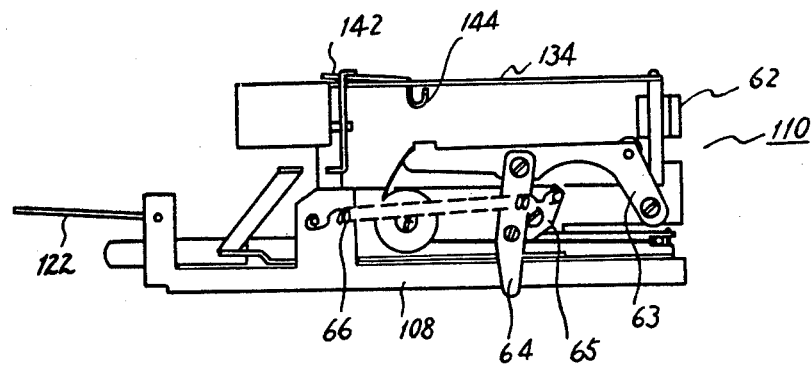

FIGS. 18A and B show the assembled holder unit 110. FIG. 18(A) shows the condition of the memory unit 30 before insertion and this is the same as the condition of FIG. 12(B).

Figure 18B:
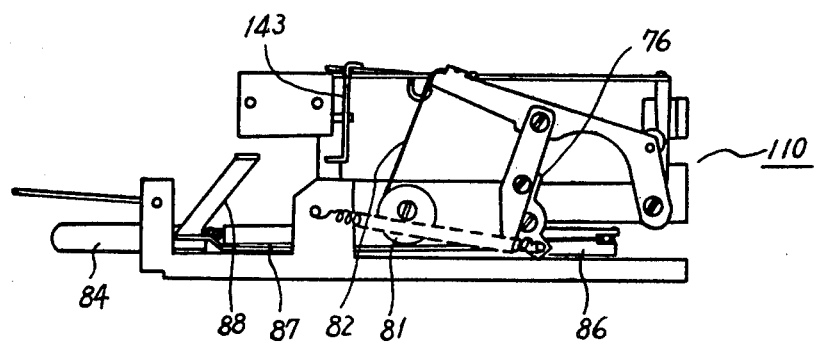
FIG. 18(B) shows the operating condition where the cassette is inserted.

FIG. 18(B) shows the condition of memory unit 30 inserted and this is the same as the condition of FIG. 12(A).

The reference numbers indicated in FIGS. 18(A), (B) are already explained in detail and further explanation is omitted here.

Generally, the holder unit 60 places the holder unit 110 of FIG. 18A in the holder case 100 of FIG. 14 and fixes it by screwing, and also mounts the metal plate 97 and print board 99.

When the memory unit 30 is inserted into the holder unit 60, the hook 76 of rotating member 65 of said holder unit 60 engages with the groove 50 along the above-mentioned operation and is locked. This condition is maintained by the stopper means. The memory unit 30 can be withdrawn by removing the stopper by pressing the eject button 84 and rotating counterclockwise the rotating member 65.

When the slide plate 34 of the memory cassette 30 covers the concave 33, the detecting chip 144 comes into contact with said slide plate 34 and, therefore, the detecting plate 142 rotates. Thereby, the photo-cam 143 is removed from the photo-sensor 101 and the bubble data read-in signal, for example, is transmitted. On the contrary, when the slide plate 34 does not close the concave 33, the detecting plate 142 does not rotate, the photo-cam 143 is detected by the photo-sensor 101, and thereby the bubble data read inhibit signal is transmitted.

When the memory unit 30 is inserted, the photo-cam 88 is located in the front side within the photo-sensor 102. When the eject button 84 is operated under this condition, the photo-cam 88 moves backward as shown in FIG. 18(A), and away from the photo-sensor 102. Thereby, the memory unit restoring signal is generated from the photo-sensor 102.

We claim:
1. An electrical connecting device comprising:
   (a) a first connector unit with
      (i) an electrical terminal and
      (ii) a groove; and
   (b) a second connector unit with
      (i) an accepting port,
      (ii) an electrical terminal,
      (iii) a rotating member having a hook for engaging the groove in the first connector, and
      (iv) a rotating lever coupled to said rotating member, wherein the first connector unit and the second connector unit are connected by inserting said first connector unit into the accepting port of the second connector unit, said rotating lever rotates when said lever is pushed by said first connector unit, thus rotating said rotating member, and engaging the hook of the rotating member with the groove of said first connector unit such that the rotating member continues to rotate in combination with the inserting operation of said first connector units, and simultaneously further pushes the first connector unit in the inserting direction, and wherein a coil spring is connected to said rotating member for biasing said first connector unit in the inserting direction.

2. An electrical connecting device as claimed in claim 1, wherein said first connector unit is a cassette type magnetic bubble memory unit, while said second connector unit is a holder unit accommodating the memory unit.

3. An electrical connecting device as claimed in claim 1, wherein the groove is a plurality of grooves, and wherein at least one of the plurality of grooves is located on each side of said first connector unit and the rotating member has a plurality of hooks such that each hook connected to a rotating member engages a corresponding groove.

4. An electrical connecting device as claimed in claim 1, wherein a slider, which is operatively connected to the rotating lever, moves in combination with rotation of said rotating member and is provided within said second connector unit, said slider locks said rotating lever after the rotating member is rotated due to insertion of the first connector unit.

5. An electrical connecting device as claimed in claim 4, wherein said second connector unit is provided with eject button means for moving said slider and for restoring said rotating member to the unlocked condition.

6. An electrical connecting device as claimed in claim 5, wherein said eject button means restores said rotating member to the unlocked condition and simultaneously electrically disconnects said first and second connector units for withdrawal of the first connector unit.

7. An electrical connecting device as claimed in claim 5 or 6, wherein said first connector unit further comprises electrical memory data therein and said eject button means is operatively connected with photo cam and photo sensor means for sending and receiving a lock restoration signal to preserve the memory data in tact when the eject button means is operated.

8. An electrical connecting device as claimed in claim 7, wherein said signal for lock restoration is generated before electrical disconnection of said first connector unit.

9. An electrical connecting device of claim 1, wherein the electrical terminal of the first connector unit is a male terminal, and the electrical terminal of the second connector unit is a female terminal.

10. An electrical connecting device, comprising:
(a) first connector unit with an electrical terminal; and
(b) a second connector unit with an accepting port, an electrical terminal and a rotating member with a coil spring connected thereto, wherein the first connector unit and the second connector unit are connected by inserting said first connector unit into the accepting port of the second connector unit the rotating member provided within the second unit engages the first connector unit, the rotating member rotates in combination with the inserting operation of the first connector unit, and further pushes the first connector unit in the inserting direction, and wherein the coil spring connected to said rotating member urges said first connector unit in the inserting direction.

* * * * *

UNITED STATES PATENT AND TRADEMARK OFFICE
CERTIFICATE OF CORRECTION

PATENT NO. : 4,466,680
DATED : August 21, 1984
INVENTOR(S) : Hirohumi Sakai et al.

It is certified that error appears in the above-identified patent and that said Letters Patent is hereby corrected as shown below:

Col. 1
Line 57, After "wherein" insert --a--.

Col. 3
Line 9, after "unit," insert --and--;
Line 26, "sensors" s/b --sensor S--.

Col. 6
Line 25, delete "means";
Line 31, delete "means";
Line 47, delete "depending on the other" and insert--, but of another--.
Line 29, delete "means".

Col. 8
Line 44, "64" (second occurrence) s/b --65--.

Col. 9
Line 37, "board" s/b --plate--.

Signed and Sealed this

Twenty-eighth Day of May 1985

[SEAL]

Attest:

DONALD J. QUIGG

Attesting Officer       Acting Commissioner of Patents and Trademarks